US008710922B2

(12) United States Patent
Holzmann (10) Patent No.: US 8,710,922 B2
(45) Date of Patent: Apr. 29, 2014

(54) METHOD AND APPARATUS FOR FILTER-LESS CLASS D AUDIO AMPLIFIER EMI REDUCTION (75) Inventor: Peter J. Holzmann, San Jose, CA (US)

(73) Assignee: Nuvoton Technology Corporation, Taiwan (CN)

( * ) Notice: Subject to any disclaimer, the term of this patent is extended or adjusted under 35 U.S.C. 154(b) by 4 days.

(21) Appl. No.: 13/470,168

(22) Filed: May 11, 2012

(65) Prior Publication Data
US 2013/0300500 A1 Nov. 14, 2013

(51) Int. Cl.
H03F 3/38 (2006.01)
H03F 3/217 (2006.01)

(52) U.S. Cl.
CPC .................................. H03F 3/217 (2013.01)
USPC .......................... 330/10; 330/251; 330/207 A (58) Field of Classification Search
USPC ........................................ 330/10, 251, 207 A
See application file for complete search history.

(56) References Cited

U.S. PATENT DOCUMENTS 7,355,473 B2    4/2008  Wu

OTHER PUBLICATIONS

Siniscalchi et al., "A 20 W/Channel Class-D Amplifier With Near-Zero Common-Mode Radiated Emissions," IEEE Journal of Solid-State Circuits, vol. 44, No. 12, Dec. 2009, pp. 3264-3271.

Primary Examiner — Robert Pascal
Assistant Examiner — Khiem Nguyen
(74) Attorney, Agent, or Firm — Kilpatrick Townsend & Stockton LLP (57) ABSTRACT An audio system includes a speaker and a class D amplifier with a class-D PWM (pulse width modulation) modulator configured for generating first and second PWM signals forming a differential signal with three differential output levels with three differential output levels. The class-D amplifier also has a differential output driver configured for driving a first and a second output signals onto a first and a second output terminals in response to the first and the second PWM signals, wherein the first and the second output signals form a differential output signal having three differential output levels. An inverse common-mode signal generator is coupled to first and second output signals for providing an inverse common-mode signal. The audio system also includes one or more output terminals for providing the inverse common mode signal, and further includes a wire or a trace on a PCB (printed circuit board).

21 Claims, 7 Drawing Sheets

METHOD AND APPARATUS FOR FILTER-LESS CLASS D AUDIO AMPLIFIER EMI REDUCTION

TECHNICAL FIELD

The present invention generally relates to audio systems. More particularly, the present invention relates to methods and systems for reducing electro-magnetic interference (EMI) from electronic circuits in an audio system.

BACKGROUND OF THE INVENTION

A class-D amplifier, sometimes known as a switching amplifier, is an electronic amplifier in which all transistors operate as binary switches. They are either fully on or fully off. CLASS-D amplifiers employ rail-to-rail output switching, where, ideally, their output transistors virtually always carry either zero current or zero voltage. Thus, their power dissipation is minimal, and they provide high efficiency over a wide range of power levels. Their advantageous high efficiency has propelled their use in various audio applications, from cell phones to flat screen televisions and home theater receivers. Class-D audio power amplifiers are more efficient than class-AB audio power amplifiers. Because of their greater efficiency, class-D amplifiers require smaller power supplies and eliminate heat sinks, significantly reducing overall system costs, size, and weight.

Class D audio power amplifiers convert audio signals into high-frequency pulses that switch the output in accordance with the audio input signal. Some class D amplifier use pulse width modulators (PWM) to generate a series of conditioning pulses that vary in width with the audio signal's amplitude. The varying-width pulses switch the power-output transistors at a fixed frequency. Other class D amplifiers may rely upon other types of pulse modulators. The following discussion will mainly refer to pulse width modulators, but those skilled in the art will recognize that class D amplifiers may be configured with other types of modulators.

Figure 1:
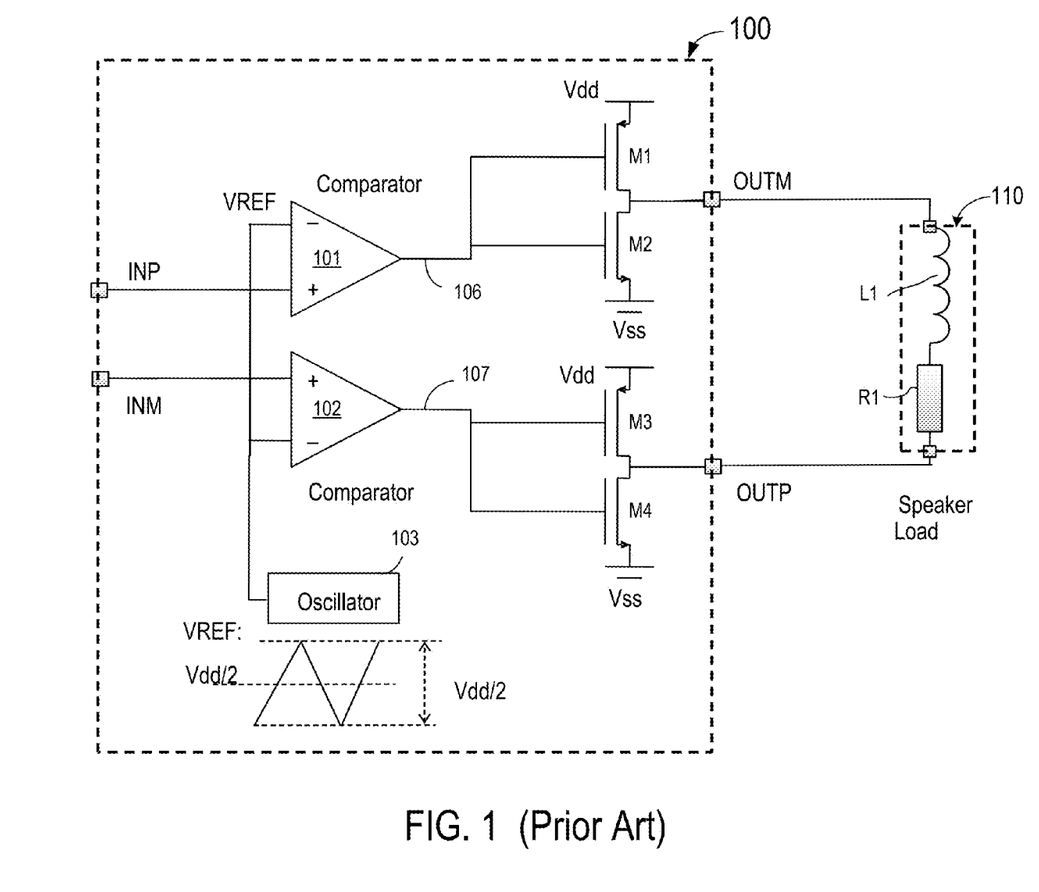
FIG. 1 shows a simplified schematic diagram illustrating a conventional class-D amplifier 100.

FIG. 1 shows a simplified schematic diagram illustrating a conventional class-D amplifier 100. The input audio signals INP and INM are input to comparators 101 and 102, where input signals INP and INM are compared with triangular waves VREF generated from an oscillator 103 to generate PWM signals 106 and 107. PWM signals 106 and 107 are coupled to the gates of transistors M1, M2, M3, and M4, respectively. Output signals OUTM and OUTP of the class D amplifier are respectively provided at terminals also labeled OUTM and OUTP. As shown in FIG. 1, output signals OUTM and OUTP are connected to a speaker load 110, which is represented by an inductor L1 and a resistor R1.

The traditional class D amplifiers have outputs OUTP and OUTM, wherein each output is complementary and has a swing range from ground Vss to Vdd. The disadvantage of class-D amplification lies in the high frequency switching noise that is produced by the switching. This high frequency noise often resulted in EMI (Electronic-Magnetic Interference).

A method for reducing EMI in class-D amplifiers is described in a paper entitled, "A 20 W/Channel Class-D Amplifier With Near-Zero Common-Mode Radiated Emissions" by P. Siniscalchi and R. Hester, IEEE JOURNAL OF SOLID-STATE CIRCUITS, VOL. 44, NO. 12, DECEMBER 2009, pp. 3264-3271. The content of this paper is incorporated by reference herein. A method for reducing EMI in class-D amplifiers is described in U.S. Pat. No. 7,355,473 to Wu, entitled, "Filterless class D power amplifier", the content of which is incorporated by reference herein.

Figure 2:
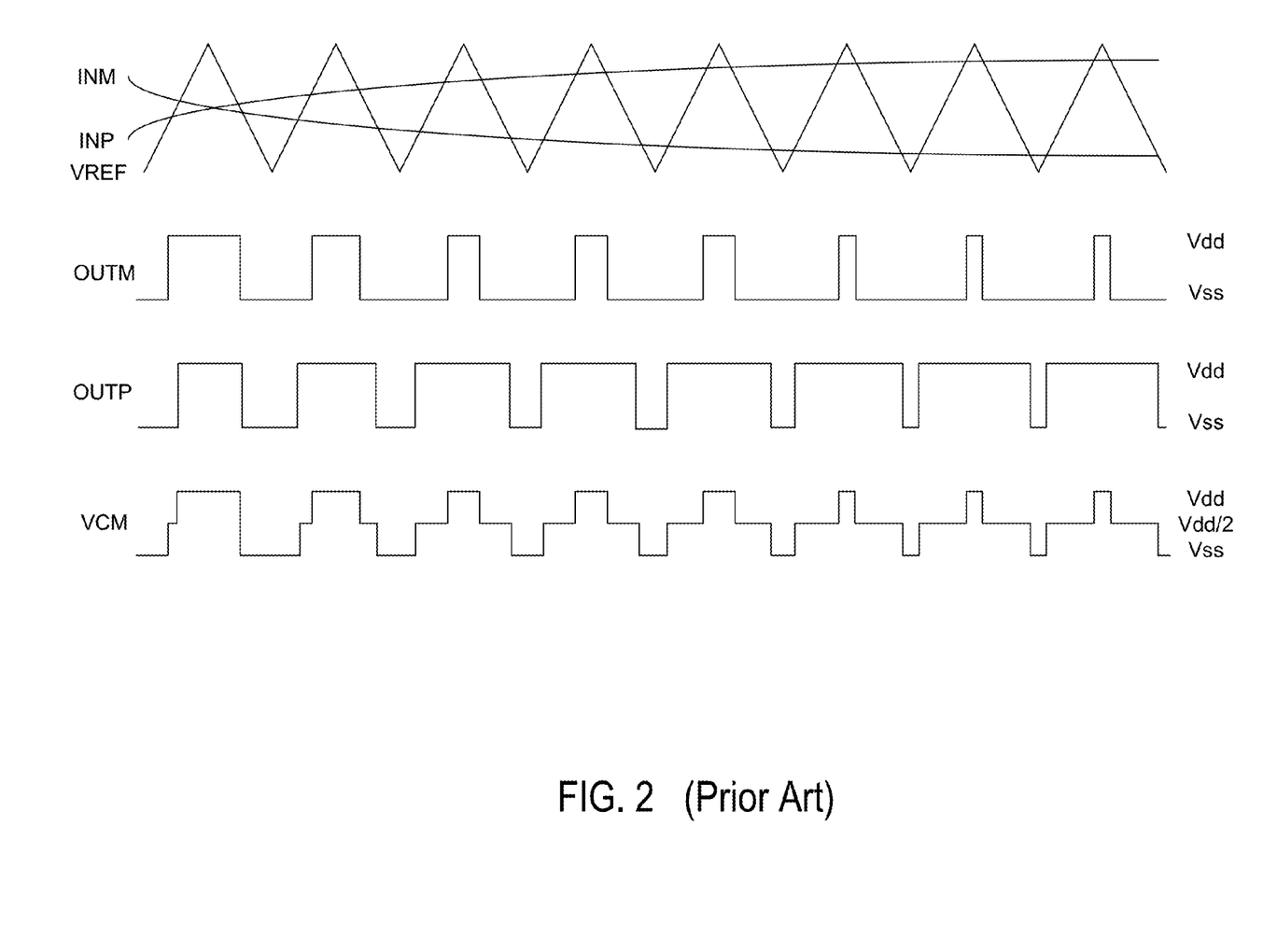
FIG. 2 is a waveform diagram illustrating the modulation of signals for the class-D amplifier of FIG. 1.

FIG. 2 is a waveform diagram illustrating the modulation of signals in the class-D amplifier of FIG. 1. As shown in FIG. 2, input signals, e.g., audio signals INM and INP, are compared with a triangular reference waveform VREF by two comparators as described above in connection with FIG. 1. The output signals of the comparators are pulse signals at a fixed frequency whose pulse width is proportional to the input signal. Two PWM signals are shown in FIG. 2 as OUTP and OUTM.

Filter-less Class-D Audio amplifiers, such as amplifier 100 of FIG. 1, employ a modulation scheme often referred to as BD-modulation. In this modulation scheme the output drivers, connected in bridge tied load configuration, switch the positive and negative side of the load to: 1) Vdd & GND; 2) GND & Vdd; 3) Vdd & Vdd; 4) GND & GND, where Vdd is the supply voltage and GND is the supply ground. As a result, the differential voltage across the load has three levels: 1) Vdd; 2) −Vdd; 3) 0. For 0 level audio output voltages the differential voltage across the load will be predominantly zero, allowing filter-less operation through an inductive speaker load.

However, even though the differential voltage across the load remains close to zero, the two terminals are switching simultaneously between Vdd & GND. This causes a large common mode output swing on the output terminals, shown as VCM in FIG. 2. When long wires or PCB traces are attached to the Class-D driver outputs, they will act as antennas, transmitting the fundamental and harmonic frequencies of the switching amplifier. As a result, the common-mode signal may lead to electromagnetic interference (EMI), and negatively impact the EMI criteria as specified by the FCC and European Standards.

BD modulating class-D amplifiers are sometimes referred to as "filter-free" because no LC filter is required to improve small signal efficiency. However, such filters are frequently required to reduce electromagnetic interference (EMI) in the range to comply with the FCC regulations on unintended transmitters. In audio applications, speaker wire and printed circuit board (PCB) traces become inadvertent antennas. Using output filters is a straightforward means of controlling these emissions, but also the most expensive in terms of actual cost and board area.

A conventional method for reducing EMI in class-D audio amplifiers is described by the paper by Siniscalchi and Hester, referenced above, in which the output common mode is maintained constant by using two new switches in parallel with the load. Another conventional method for reducing EMI in class-D audio amplifiers is described in U.S. Pat. No. 7,355,473 to Wu, in which a double reference wave modulation scheme is used for reducing EMI. Both methods offer their respective advantages, but require additional components and increased complexity.

From the above, it is clear that an improved method for reducing EMI in class-D amplifiers is highly desirable.

BRIEF SUMMARY OF THE INVENTION

The present invention generally relates to audio systems. More particularly, the present invention provides a method and system for reducing electro-magnetic interference (EMI) from electronic circuits in an audio system. Merely by way of example, the present invention has been applied to reduce EMI in filter-less class-D audio amplifiers, but it would be recognized that the invention has a much broader range of applications.

In some embodiments of the present invention, an integrated circuit (IC) chip having a class D amplifier for filterless application includes a class-D PWM modulator configured for generating first and second PWM signals, each with two output levels. The first and the second PWM signals form a differential signal with three differential output levels. The IC also includes a differential output driver configured for driving a first and a second output signals onto a first and a second output pins in response to the first and the second PWM signals, wherein each of the first and the second output signals has two output levels. The first and the second output signals form a differential output signal having three differential output levels. The IC further includes an inverse output signal generator coupled to the first and second output signals for providing an inverse common-mode one or more inverse output signals, and one or more inverse output pins coupled to the one or more inverse common mode output signals.

In some embodiments of the above IC, the inverse output signal is related to an inverse of a sum of the first and the second output signals. In some embodiments, the inverse common-mode signal generator includes a first transistor, a first resistor, a second resistor, and a second transistor coupled in series. The first and the second transistors are coupled to the first output signal. The inverse common-mode signal generator also includes a third transistor, a third resistor, a fourth resistor, and a fourth transistor coupled in series, with the third and the fourth transistors coupled to the second output signal. A first node between the first and the second resistors is coupled to a second node between the third and the fourth resistors for providing the inverse common-mode signal. In an embodiment, the first and the third transistors are PMOS transistors, and the second and the fourth transistors are NMOS transistors. In some embodiments, the first, second, third, and fourth resistors are scaled to provide output levels of Vdd, Vss, and Vdd/2 and are scaled to reduce EMI due to common mode emissions, wherein Vdd is the power supply voltage.

In some embodiments of the above IC, the first and the second output pins are configured for coupling to a speaker without a filter. In some embodiment, each of the first and the second amplifier circuits comprises a PMOS transistor and an NMOS transistor coupled in series. In some embodiments, each of the inverse output signals is related to an inverse of an output signal.

According to some other embodiments of the invention, IC chip includes one or more input pins for receiving one or more input signals, and a first signal processing circuit coupled to the one or more input signals and configured for providing a first and a second output signals. The IC chip also includes a first and a second output pins coupled to the first and the second output signals, respectively, wherein a common-mode signal is related to a sum of the first and the second output signals. The IC chip also includes a second signal processing circuit coupled to first and second output signals for providing an inverse common-mode signal which is related to an inverse of the sum of the first and the second output signals. The IC chip further includes a third output pin for providing the inverse common mode signal.

In some embodiments of the above IC chip, the one or more input signals comprise a first and a second input signals. In an embodiment, the inverse common-mode signal is equal to an inverse of half of the sum of the first and the second output signals. In some embodiments, the first signal processing circuit comprises first and second comparators coupled respectively to the first and second input signals and a triangular reference voltage signal for providing first and second PWM signals. In some embodiments the inverse common-mode signal generator includes a first transistor, a first resistor, a second resistor, and a second transistor coupled in series, with the first and the second transistors coupled to the first output signal, and a third transistor, a third resistor, a fourth resistor, and a fourth transistor coupled in series, with the third and the fourth transistors coupled to the second output signal. A first node between the first and the second resistors is coupled to a second node between the third and the fourth resistors for providing the inverse common-mode signal. In some embodiments, the first and the third transistors are PMOS transistors, and the second and the fourth transistors are NMOS transistors.

According to an alternative embodiment, an audio system includes a class D amplifier. The class-D amplifier includes a class-D PWM modulator configured for generating first and second PWM signals. The first and the second PWM signals form a differential signal with three differential output levels. The class-D amplifier also has a output driver configured for driving a first and a second output signals onto a first and a second output terminals in response to the first and the second PWM signals. The first and the second output signals form a differential output signal having three differential output levels. An inverse common-mode signal generator is coupled to first and second output signals for providing an inverse common-mode signal. The audio system also includes one or more output terminals for providing the inverse common mode signal, and a speaker having first and second input connectors coupled to the first and the second output terminals, respectively, and a wire or a trace on a PCB (printed circuit board) coupled to the third output terminal.

In some embodiments of the above audio system, the inverse common-mode signal is equal to an inverse of half of the sum of the first and the second output signals. In an embodiment, the inverse common-mode signal generator includes a first transistor, a first resistor, a second resistor, and a second transistor coupled in series, with the first and the second transistors coupled to the first output signal, and a third transistor, a third resistor, a fourth resistor, and a fourth transistor coupled in series, the third and the fourth transistors coupled to the second output signal. A first node between the first and the second resistors is coupled to a second node between the third and the fourth resistors for providing the inverse common-mode signal. In some embodiments, the first and the third transistors are PMOS transistors, and the second and the fourth transistors are NMOS transistors. In some embodiments each of the first and the second amplifier circuits comprises a PMOS transistor and an NMOS transistor coupled in series. In some embodiments, a length of the wire or trace on a PCB is selected to minimize electromagnetic interference (EMI) caused by the common-mode signal. In some embodiments, the class D amplifier is included in an integrated circuit (IC) chip, and each of the terminals is coupled to a pin of the IC.

A further understanding of the nature and advantages of the present invention may be realized by reference to the remaining portions of the specification and the drawings.

DETAILED DESCRIPTION OF THE INVENTION

Figure 3:
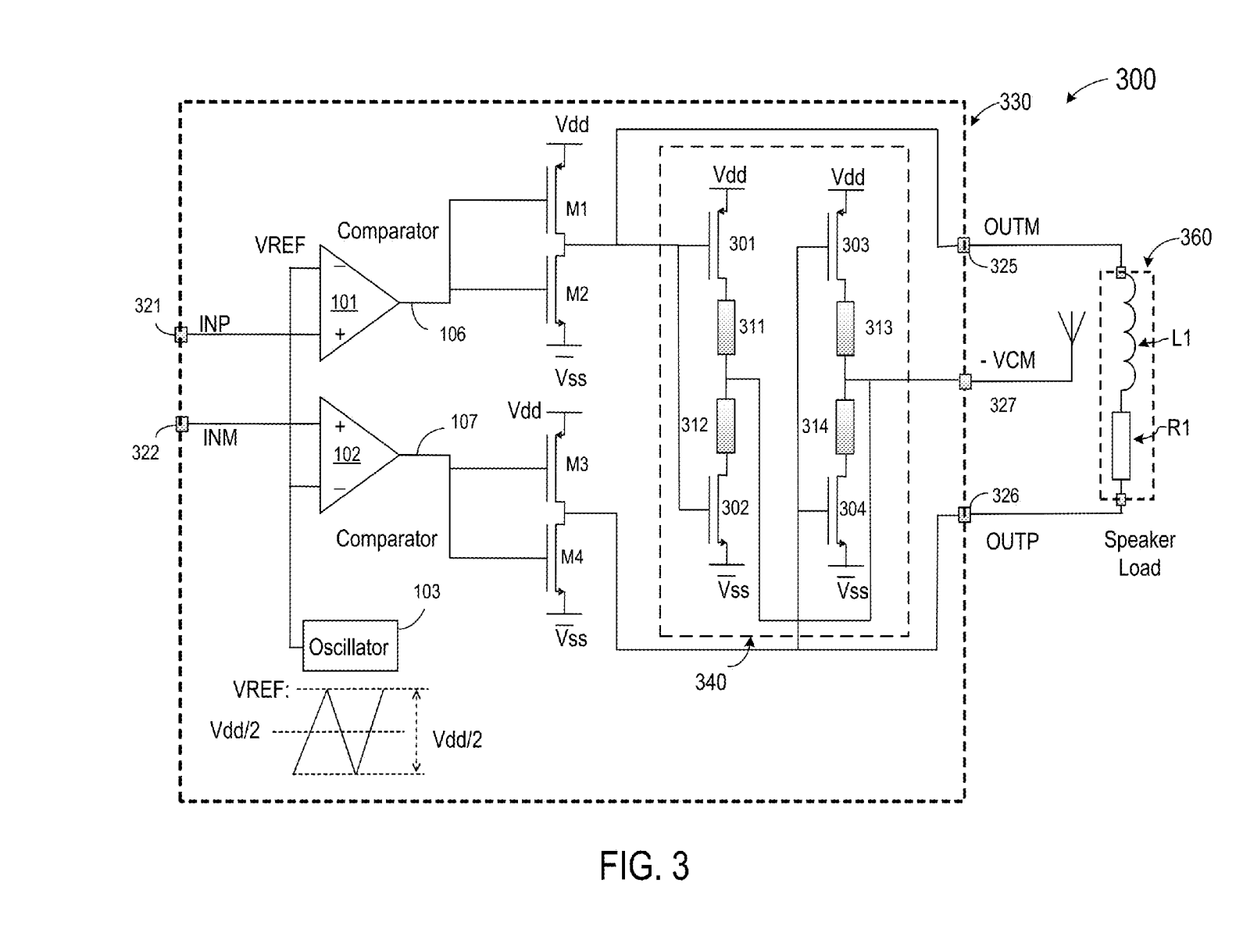
FIG. 3 shows a simplified schematic diagram illustrating an audio system 300 including a class-D amplifier 330 according to some embodiments of the present invention.

FIG. 3 shows a simplified schematic diagram illustrating an audio system 300 including a class-D amplifier 330 according to some embodiments of the present invention. As shown, audio system 300 includes a class-D amplifier 330, a speaker 360, and an antenna 370. Class-D amplifier 330 includes some similar components as amplifier 100 in FIG. 1, and they are labeled with the corresponding reference numerals. For example, input terminals 321 and 322 provide input audio signals INP and INM to comparators 101 and 102, where input signals INP and INM are compared with triangular waves VREF generated from an oscillator 103 to generate PWM signals 106 and 107. PWM signals 106 and 107 are coupled to gates of transistors M1, M2, M3, and M4, respectively. Output signals OUTM and OUTP of the class D amplifier are respectively provided at terminals 325 and 326. As shown in FIG. 3, output signals OUTM and OUTP are connected to a speaker load 360, which is represented by an inductor L1 and a resistor R1.

As shown in FIG. 3, class-D amplifier 330 also includes an inverse common-mode signal generator 340. Inverse common-mode signal generator 340 includes transistor 301, 302, 303, and 304, and resistors 311, 312, 313, and 314. Output signal OUTM is coupled to transistors 301 and 302 which are connected in series with resistors 311 and 312. Output signal OUTP is coupled to transistors 303 and 304 which are connected in series with resistors 313 and 314. Node 316, which is between transistor 301 and 302, is connected with node 317, which is between transistors 303 and 304. Both node 316 and 317 are connected to output terminal 327 to provide an inverse common-mode signal −VCM or VCMN. Note that VCMN=−VCM=−(OUTP+OUTM)/2.

In some embodiments, class-D amplifier 330 is provided in an integrated circuit chip with input pins 321 and 322 for input signals INP and INM, respectively, and output pins 325, 326, and 327 for output signals OUTM, OUTP, and −VCM, respectively. As described above in connection with FIG. 1, output signals OUTM and OUTP include a common mode signal, VCM=(OUTP+OUTM)/2, which can cause EMI. As shown in FIG. 3, either a wire or PCB trace is added to pin VCMN to serve as an antenna 370, which can radiate the inverse common-mode signal VCMN=−(OUTP+OUTM)/2. In this manner, the inverse common-mode signal can compensate the common-mode signal to reduce or eliminate EMI from the common-mode signal. In some embodiments, a length of the wire or trace on a PCB is selected to minimize electromagnetic interference (EMI) caused by the common-mode signal.

Figure 4:
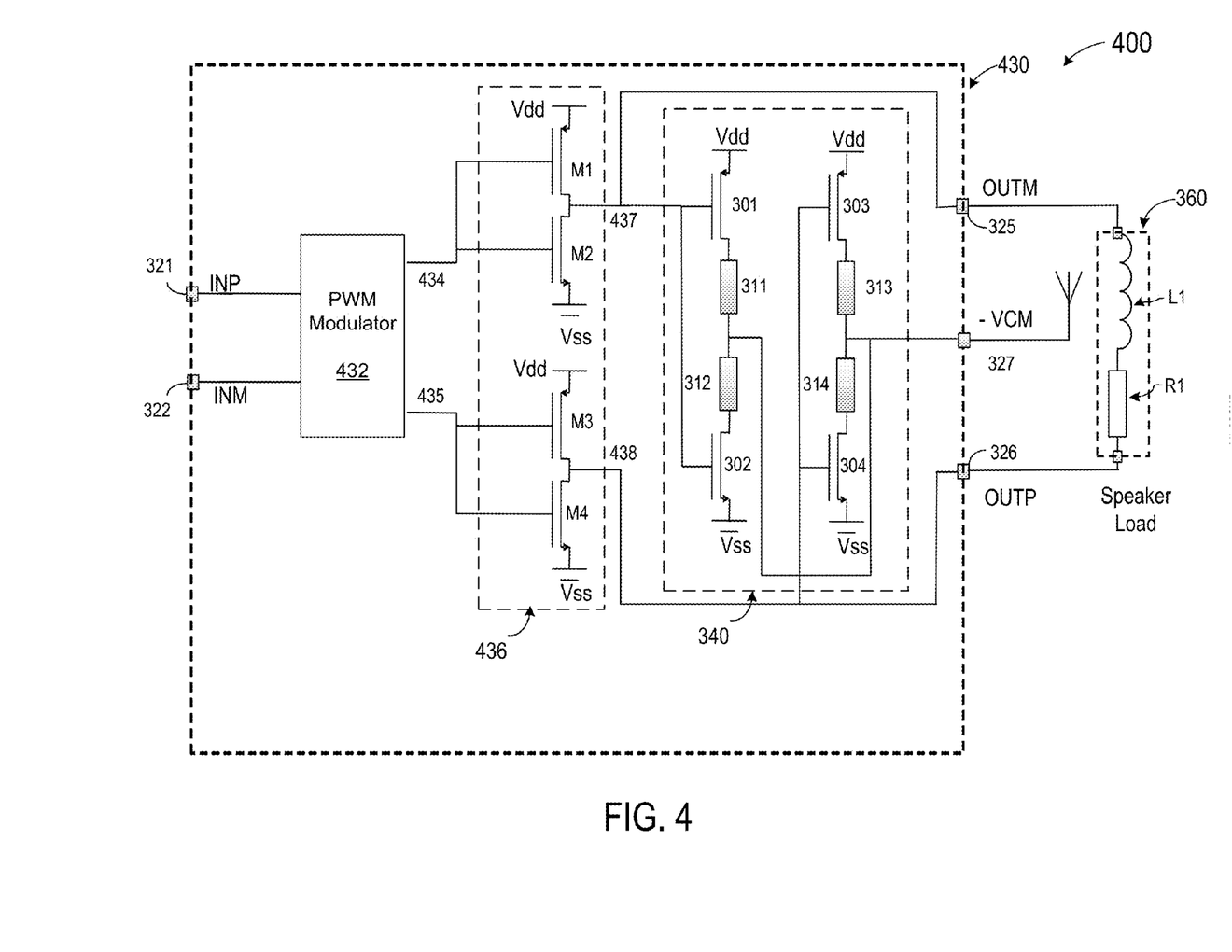
FIG. 4 shows a simplified schematic diagram illustrating an audio system 400 including a class-D amplifier 430 according to alternative embodiments of the present invention.

FIG. 4 shows a simplified schematic diagram illustrating an audio system 400 including a class-D amplifier 430 according to alternative embodiments of the present invention. As shown, audio system 400 has similar components as audio system 300 of FIG. 3, and corresponding components are labeled with the same reference numerals. Note, however, in audio system 400, the input processing circuit is replaced with a PWM modulator 432.

Thus according to some embodiments, an audio system 400 shown in FIG. 4 includes a class D amplifier 430, a speaker 360 having first and second input connectors coupled to the first and the second output terminals 325 and 326 of amplifier 430, respectively, and a wire or a trace on a PCB (printed circuit board) coupled to a third output terminal 327 of amplifier 430. In FIG. 4, the wire or trace on a PCB is shown as an antenna 370. In some embodiments, amplifier 430 can be implemented as an integrated circuit chip. In other embodiments, amplifier 430 can be implemented in an integrated circuit chip that may have other components, such as a digital audio signal processor.

As shown in FIG. 4, amplifier 430 includes a class-D PWM modulator 432 configured for generating first and second PWM signals 434 and 435, each with two output levels. The first and second PWM signals 434 and 435 form a differential signal with three differential output levels. A differential output driver 436, configured for driving a first and a second output signals 437 and 438 onto a first and a second output terminals 325 and 326 in response to the first and the second PWM signals 434 and 435, wherein each of the first and the second output signals has two output levels, Vdd and Vss. As shown in FIG. 4, differential output driver 436 includes transistors M1, M2, M3, and M4. An inverse common-mode signal generator 340, coupled to first and second output signals for providing an inverse common-mode signal −VCM. Output terminal 327 is configured for providing the inverse common mode signal −VCM.

Figure 5:
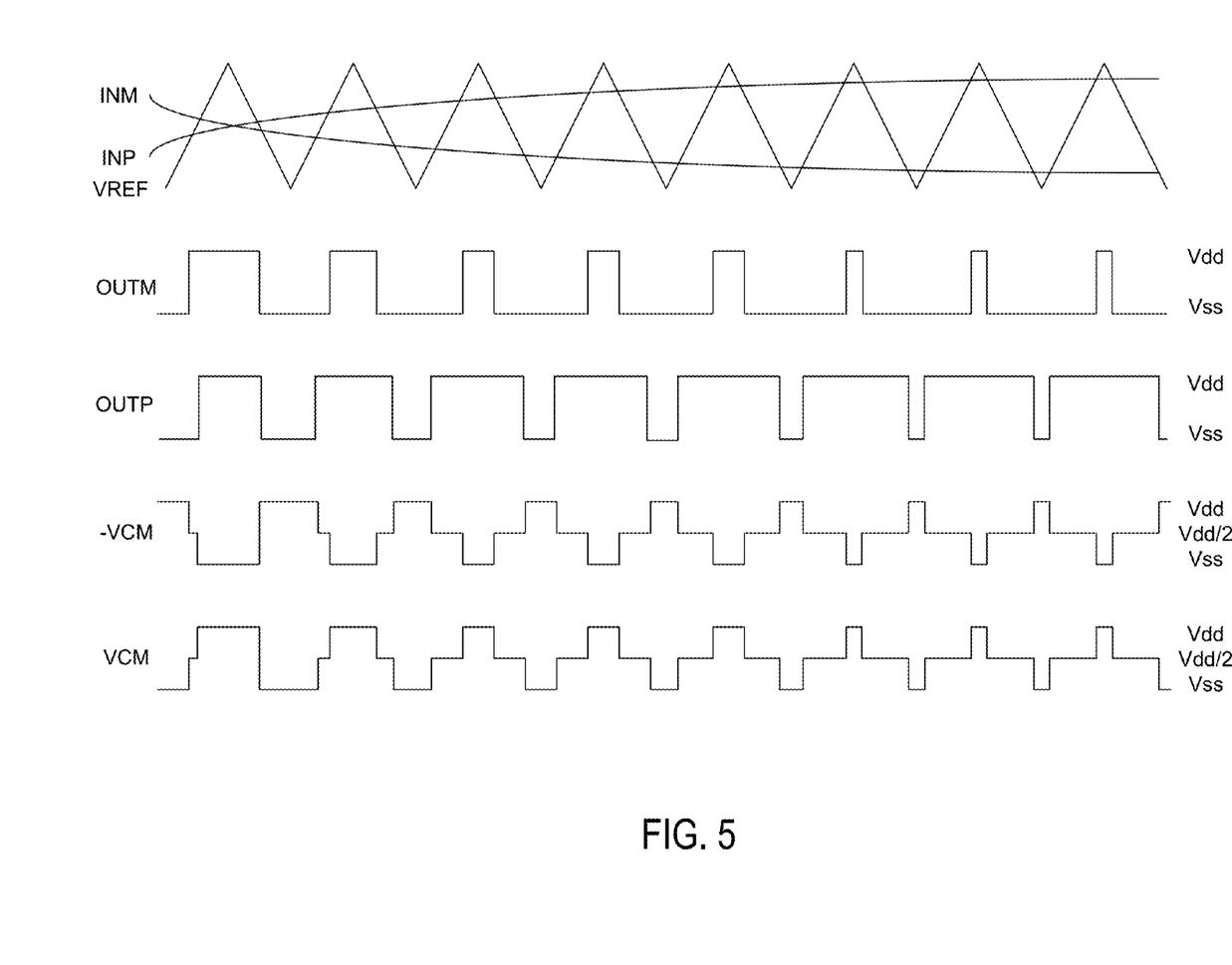
FIG. 5 is waveform diagram illustrating the modulation of signals for the class-D amplifier of FIG. 4 according to an embodiment of the present invention.

FIG. 5 is waveform diagram illustrating the modulation of signals for the class-D amplifier for class-D amplifier 430 of FIG. 4 according to an embodiment of the present invention. As shown in FIG. 5, input signals, e.g., audio signals INM and INP, are compared with a triangular reference waveform VREF by a PWM modulator as described above in connection with FIG. 4. The output signals of the PWM modulator are pulse signals at a fixed frequency whose pulse width is proportional to the input signal. Two PWM signals are shown in FIG. 4 as OUTP and OUTM. It can be seen that OUTP and OUTM each can have two voltage levels, Vdd and Vss. Therefore, the differential output audio signal between OUTP and OUTM feeding the speaker load can have one of three output levels, (Vdd−Vss), (Vss−Vddd), and 0. When Vss=0, the three output levels are +Vdd, −Vdd, and 0. Also shown in FIG. 5 is the reverse common mode signal −VCM generated by the reverse common mode signal generator. For comparison, the common mode signal VCM is also shown in FIG. 5. VCM=(OUTP+OUTM)/2. As shown in FIG. 5, OUTP and OUTM each can have two signal levels, Vdd and Vss. A special case with Vss=0 is shown in FIG. 5, in which VCM can have three different levels Vdd, Vdd/2, and Vss (which is 0). In embodiments of the invention, the inverse output signal is fed to an output terminal. The inverse output signal which is coupled to a wire or a trace in a PCB for radiating the inverse output signal. The wire or PCB trace is configured to reduce or cancel EMI signals generated by the corresponding out signal, e.g., the common mode signal. For example, the length and/or shape of the wire or PCB trace can be selected, e.g., by simulation or experimentation, to reduce or cancel EMI signals.

Figure 6:
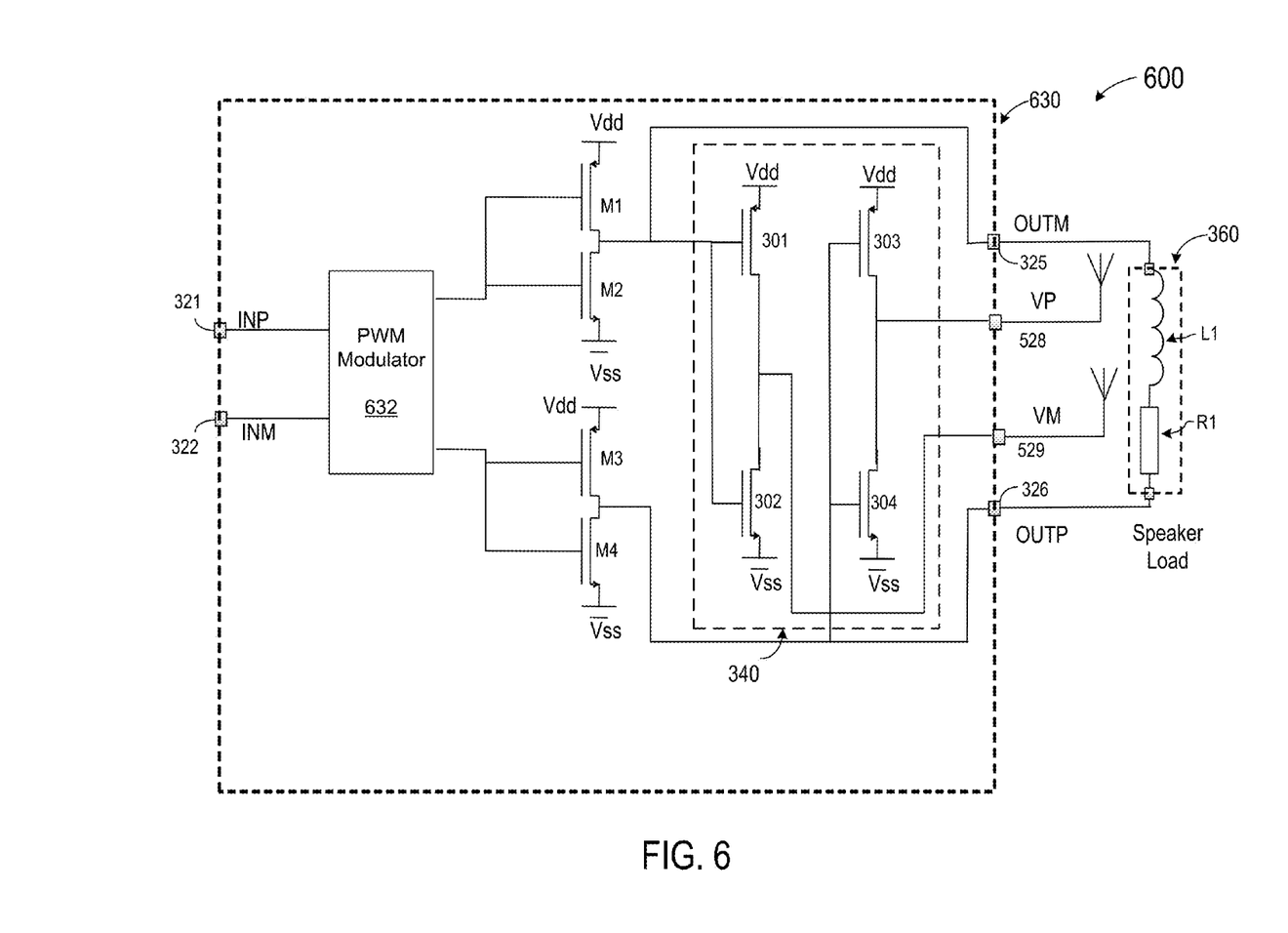
FIG. 6 shows a simplified schematic diagram illustrating an audio system 600 including a class-D amplifier 630 according to another embodiment of the present invention.

FIG. 6 shows a simplified schematic diagram illustrating an audio system 600 including a class-D amplifier 630 according to another embodiment of the present invention. As shown in FIG. 6, audio system 600 is similar to audio system 400 of FIG. 4, with the exception that, instead of the reverse common mode signal in FIG. 4, amplifier 630 provides two inverse output signals VP and VM at two output terminals 528 and 529, respectively. The inverse output signals VP and VM are connected to antennas, which could be implemented as wires or PCB traces. The wire or PCB trace is configured to reduce or cancel EMI signals generated by the corresponding out signal.

Figure 7:
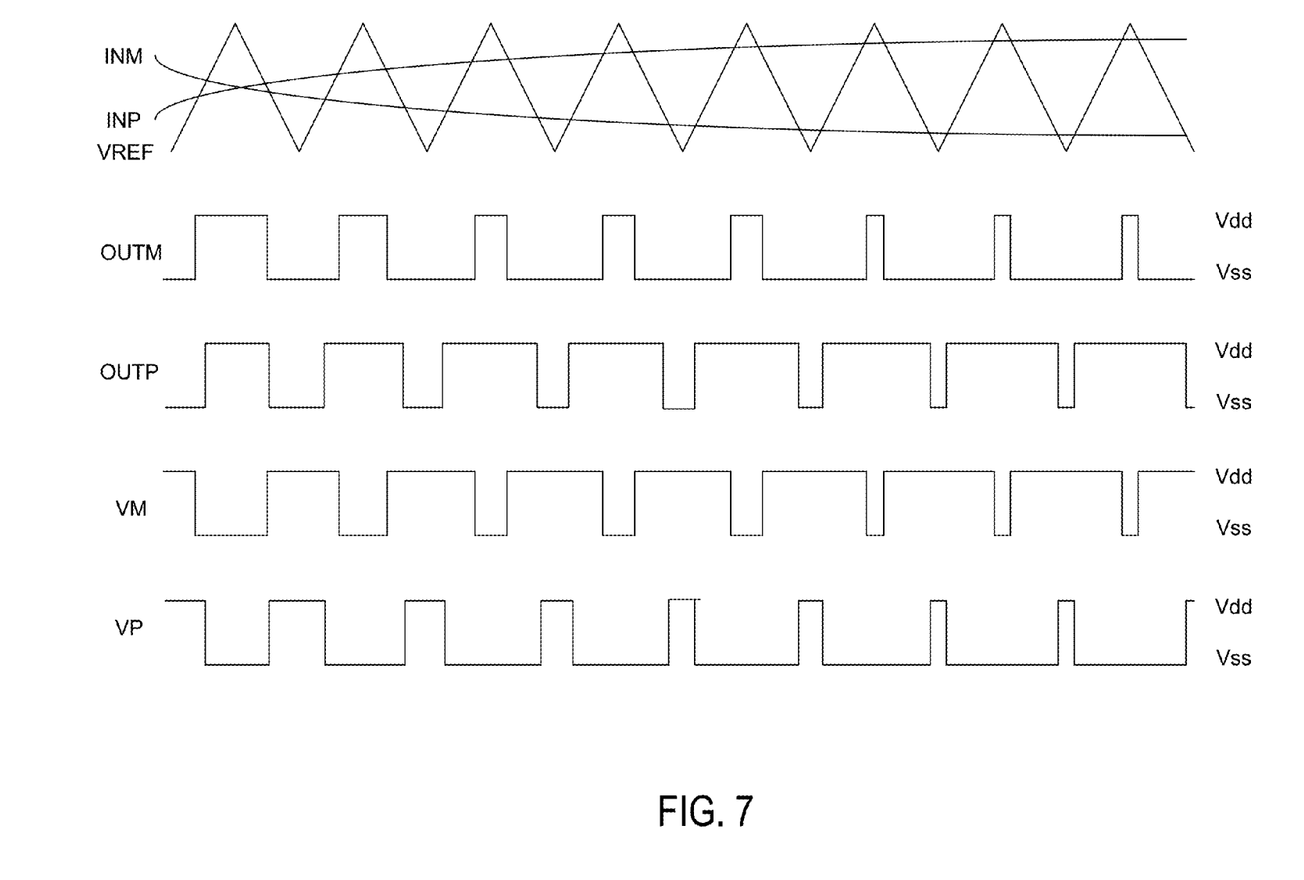
FIG. 7 is a waveform illustrating the modulation of signals for the class-D amplifier of FIG. 6 according to an embodiment of the present invention.

FIG. 7 is a waveform illustrating the modulation of signals for the audio system 600 of FIG. 6 according to an embodiment of the present invention. It can be seen that output signal VM is the inverse of output signal OUTM, and output signal VP is the inverse of output signal OUTP.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. An integrated circuit (IC) chip having a class D amplifier for filter-less application, comprising:
   a class-D PWM (pulse width modulation) modulator configured for generating first and second PWM signals, the first and the second PWM signals forming a differential signal with three differential output levels;
   a differential output driver, configured for driving a first and a second output signals onto a first and a second output pins in response to the first and the second PWM signals, wherein the first and the second output signals form a differential output signal having three differential output levels;
   an inverse output signal generator, coupled to the first and second output signals for providing one or more inverse output signals; and
   one or more inverse output pins coupled to the one or more inverse output signals.

2. The integrated circuit chip of claim 1, wherein the inverse output signal generator is configured for providing an-inverse output signal related to sum of inverses of the first and the second output signals.

3. The integrated circuit chip of claim 2, wherein the inverse output signal generator comprises:
   a first transistor, a first resistor, a second resistor, and a second transistor coupled in series, the first and the second transistors coupled to the first output signal; and
   a third transistor, a third resistor, a fourth resistor, and a fourth transistor coupled in series, the third and the fourth transistors coupled to the second output signal;
   wherein a first node between the first and the second resistors is coupled to a second node between the third and the fourth resistors for providing an inverse common-mode signal.

4. The integrated circuit chip of claim 3, wherein the first and the third transistors are PMOS transistors, and the second and the fourth transistors are NMOS transistors.

5. The integrated circuit chip of claim 3, wherein the first, second, third, and fourth resistors are scaled to provide output levels of Vdd, Vdd/2, and Vss, and are scaled to reduce EMI due to common mode emissions, wherein Vdd is the power supply voltage and Vss is a ground voltage.

6. The integrated circuit chip of claim 1, wherein the first and the second output pins are configured for coupling to a speaker without a filter.

7. The integrated circuit chip of claim 1, wherein each of the first and the second amplifier circuits comprises a PMOS transistor and an NMOS transistor coupled in series.

8. The integrated circuit chip of claim 1,
   wherein the inverse output signal generator is configured for providing two inverse output signals, each of the two inverse output signals is related to an inverse of one of the first and second output signals.

9. An integrated circuit (IC) chip, comprising:
   one or more input pins for receiving one or more input signals;
   a first signal processing circuit coupled to the one or more input signals and configured for providing a first and a second output signals;
   a first and a second output pins coupled to the first and the second output signals, respectively, wherein a common-mode signal is related to a sum of the first and the second output signals;
   a second signal processing circuit, coupled to first and second output signals for providing an inverse common-mode signal which is related to sum of inverses of the first and the second output signals; and
   a third output pin for providing the inverse common mode signal.

10. The integrated circuit chip of claim 9, wherein the one or more input signals comprise a first and a second input signals.

11. The integrated circuit chip of claim 10, wherein the inverse common-mode signal is equal to an inverse of half of the sum of the first and the second output signals.

12. The integrated circuit chip of claim 10, wherein the first signal processing circuit comprises first and second comparators coupled respectively to the first and second input signals and a triangular reference voltage signal for providing first and second PWM signals.

13. The integrated circuit chip of claim 10, wherein the inverse common-mode signal generator comprises:
   a first transistor, a first resistor, a second resistor, and a second transistor coupled in series, the first and the second transistors coupled to the first output signal; and
   a third transistor, a third resistor, a fourth resistor, and a fourth transistor coupled in series, the third and the fourth transistors coupled to the second output signal;
   wherein a first node between the first and the second resistors is coupled to a second node between the third and the fourth resistors for providing the inverse common-mode signal.

14. The integrated circuit chip of claim 10, wherein the first and the third transistors are PMOS transistors, and the second and the fourth transistors are NMOS transistors.

15. An audio system, comprising:
   a class D amplifier, comprising:
      a class-D PWM (pulse width modulation) modulator configured for generating first and second PWM signals, the first and the second PWM signals forming a differential signal with three differential output levels;
      a differential output driver, configured for driving a first and a second output signals onto a first and a second output terminals in response to the first and the second PWM signals wherein the first and the second output signals form a differential output signal having three differential output levels;
      an inverse common-mode signal generator, coupled to first and second output signals for providing an inverse common-mode signal; and one or more inverse output terminals for providing the inverse common mode signal;

a speaker having first and second input connectors coupled to the first and the second output terminals, respectively; and a wire or a trace on a PCB (printed circuit board) coupled to the inverse common mode signal.

16. The audio system of claim 15, wherein the inverse common-mode signal is equal to an inverse of half of the sum of the first and the second output signals.

17. The audio system of claim 15, wherein the inverse common-mode signal generator comprises:

a first transistor, a first resistor, a second resistor, and a second transistor coupled in series, the first and the second transistors coupled to the first output signal; and a third transistor, a third resistor, a fourth resistor, and a fourth transistor coupled in series, the third and the fourth transistors coupled to the second output signal;

wherein a first node between the first and the second resistors is coupled to a second node between the third and the fourth resistors for providing the inverse common-mode signal.

18. The audio system of claim 17, wherein the first and the third transistors are PMOS transistors, and the second and the fourth transistors are NMOS transistors.

19. The audio system of claim 15, wherein each of the first and the second amplifier circuits comprises a PMOS transistor and an NMOS transistor coupled in series.

20. The audio system of claim 15, wherein a length of the wire or trace on a PCB is selected to minimize electromagnetic interference (EMI) caused by the common-mode signal.

21. The audio system of claim 15, wherein the class D amplifier is included in an integrated circuit (IC) chip, and each of the terminals is coupled to a pin of the IC.

* * * * *